United States Patent
Cai

(10) Patent No.: US 9,660,074 B2
(45) Date of Patent: May 23, 2017

(54) METHODS AND APPARATUS FOR LDMOS DEVICES WITH CASCADED RESURF IMPLANTS AND DOUBLE BUFFERS

(71) Applicant: Texas Instruments Incorporated, Dallas, TX (US)

(72) Inventor: Jun Cai, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/808,991

(22) Filed: Jul. 24, 2015

(65) Prior Publication Data
US 2016/0043217 A1    Feb. 11, 2016

Related U.S. Application Data

(60) Provisional application No. 62/034,378, filed on Aug. 7, 2014.

(51) Int. Cl.
*H01L 29/78*    (2006.01)
*H01L 29/06*    (2006.01)
(Continued)

(52) U.S. Cl.
CPC .... *H01L 29/7823* (2013.01); *H01L 21/26513* (2013.01); *H01L 27/0922* (2013.01);
(Continued)

(58) Field of Classification Search
CPC ........... H01L 29/7823; H01L 21/26513; H01L 27/088; H01L 29/0634; H01L 29/0649;
(Continued)

(56) References Cited

U.S. PATENT DOCUMENTS 5,640,034 A    6/1997  Malhi
5,686,755 A   11/1997  Malhi
(Continued)

FOREIGN PATENT DOCUMENTS

EP    0562271 A1    2/1993

OTHER PUBLICATIONS

Sunitha, HD; Keshaveni, N., "Reduced Surface Field Technology for LDMOS: A Review," International Journal of Emerging Technology and Advanced Engineering, Jun. 2014, pp. 173-176, vol. 4, Issue 6, www.ijetae.com, World Wide Web: Jul. 24, 2015: http://www.ijetae.com/files/Volume4Issue6/IJETAE_0614_26.pdf.

*Primary Examiner* — Fernando L Toledo
*Assistant Examiner* — Adam S Bowen
(74) *Attorney, Agent, or Firm* — Jacqueline J. Garner; Charles A. Brill; Frank D. Cimino

(57) ABSTRACT

LDMOS devices are disclosed. An LDMOS device includes at least one drift region disposed in a portion of a semiconductor substrate; at least one isolation structure at a surface of the semiconductor substrate; a D-well region positioned adjacent a portion of the at least one drift region, and an intersection of the drift region and the D-well region forming a junction between first and second conductivity types; a gate structure disposed over the semiconductor substrate; a source contact region disposed on the surface of the D-well region; a drain contact region disposed adjacent the isolation structure; and a double buffer region comprising a first buried layer lying beneath the D-well region and the drift region and doped to the second conductivity type and a second high voltage deep diffusion layer lying beneath the first buried layer and doped to the first conductivity type. Methods are disclosed.

19 Claims, 13 Drawing Sheets

(51) Int. Cl.
*H01L 29/10* (2006.01)
*H01L 29/08* (2006.01)
*H01L 21/265* (2006.01)
*H01L 29/66* (2006.01)
*H01L 27/092* (2006.01)
*H01L 21/8238* (2006.01)

(52) U.S. Cl.
CPC ...... *H01L 29/0634* (2013.01); *H01L 29/0649* (2013.01); *H01L 29/0653* (2013.01); *H01L 29/0856* (2013.01); *H01L 29/0873* (2013.01); *H01L 29/1095* (2013.01); *H01L 29/66681* (2013.01); *H01L 29/78* (2013.01); *H01L 21/823814* (2013.01)

(58) Field of Classification Search
CPC ............ H01L 29/0653; H01L 29/0856; H01L 29/0873; H01L 29/1095; H01L 29/66681; H01L 29/78
USPC ........................................................ 257/337
See application file for complete search history.

(56) References Cited

U.S. PATENT DOCUMENTS

| | | | |
|---|---|---|---|
| 6,531,355 | B2 | 3/2003 | Mosher et al. |
| 6,900,101 | B2 | 5/2005 | Lin |
| 6,958,515 | B2 * | 10/2005 | Hower ................ H01L 29/0878 257/331 |
| 7,785,974 | B2 | 8/2010 | Hu et al. |
| 8,530,296 | B2 | 9/2013 | Hao et al. |
| 2008/0197408 | A1 * | 8/2008 | Disney ................ H01L 29/7811 257/335 |
| 2012/0037984 | A1 * | 2/2012 | Yu ....................... H01L 29/0847 257/335 |
| 2013/0087850 | A1 * | 4/2013 | Alberhasky ........... H01L 27/088 257/329 |
| 2013/0341717 | A1 * | 12/2013 | Chen ................. H01L 29/66659 257/337 |
| 2014/0070315 | A1 * | 3/2014 | Levy ................... H01L 29/0634 257/343 |
| 2014/0225191 | A1 * | 8/2014 | Lotfi ..................... H01L 21/761 257/337 |
| 2015/0380398 | A1 * | 12/2015 | Mallikarjunaswamy H01L 29/7823 257/272 |

\* cited by examiner

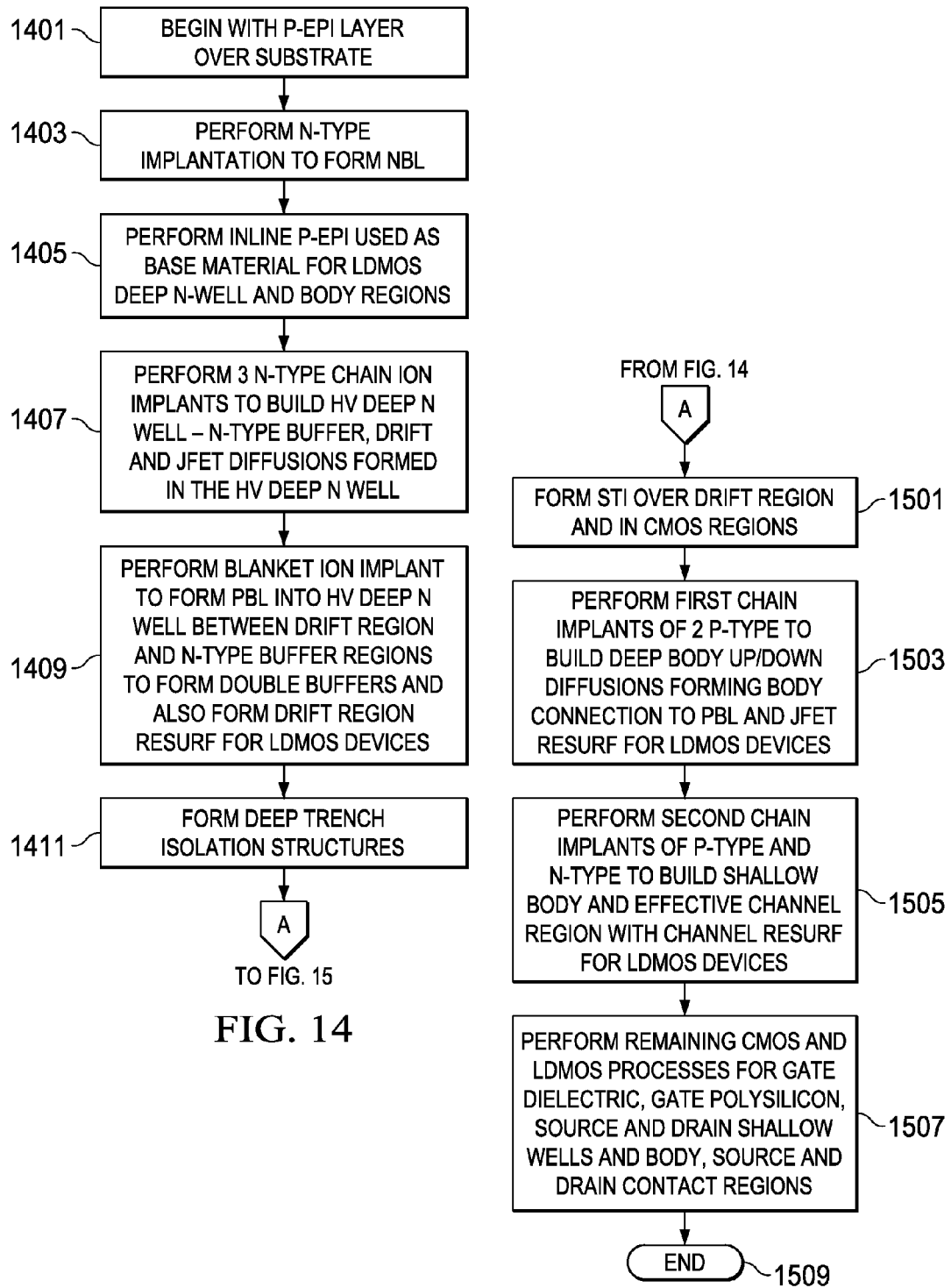

METHODS AND APPARATUS FOR LDMOS DEVICES WITH CASCADED RESURF IMPLANTS AND DOUBLE BUFFERS

CROSS-REFERENCE TO RELATED APPLICATION

This application claims priority to U.S. Provisional Patent Application Ser. No. 62/034,378, filed Aug. 7, 2014, titled "LDMOS CASCADE RESURF," which application is hereby incorporated by reference herein in its entirety.

TECHNICAL FIELD

The present application relates to the field of integrated circuits (ICs) and more specifically to the fabrication of lateral double-diffused metal oxide semiconductor (LDMOS) devices.

BACKGROUND

The need for transistors which can provide high power drive capacity on semiconductor integrated circuits led to the development of lateral double-diffused metal oxide semiconductor (LDMOS) devices. Applications that are particularly significant for LDMOS devices include high and low side drivers for output buffers, radio frequency (RF) circuitry, and the like. Double diffused MOS devices (DMOS) are used for applications where high voltage capacity and low resistance are needed. LDMOS transistors exhibit high breakdown voltage BVdss and low on resistance RDSon, and are therefore well suited to high power applications.

In a transistor formed with a DMOS process, source and backgate diffusions are formed by simultaneous or contemporaneously performed ion implantation into the substrate and subsequent drive anneals. Drain diffusions are spaced from a channel region underlying a gate electrode by a drift region, which can be formed underlying an isolation region. The spacing between the resulting diffusions at the surface of the semiconductor substrate determines the channel length of the LDMOS transistor.

FIG. 1 depicts in a cross sectional view a conventional LDMOS device 100. In FIG. 1, a p-type semiconductor substrate 110 is provided. A p-type epitaxial layer 114 is shown in FIG. 1 formed over the substrate. An N type buried layer labeled "NBL" and numbered 120 is shown at the bottom of the LDMOS structure, NBL 120 is formed by a photomask patterning and ion implantation step. In addition, P type buried regions labeled "PBL" and numbered 116 are shown. These regions are formed with a second separate mask patterning and separate ion implantation step. The LDMOS device 100 includes two symmetric portions on either side of a source region formed in a diffusion DWL 136, each side having a gate and drain arrangement, typically these regions are coupled together to form a large transistor, although alternatively two transistors with a common source and backgate portion can be formed. Many regions similarly formed and arranged may be coupled in common to form still larger transistors.

In FIG. 1, deep N well regions numbered 118 are shown on either side of the EPI region 114. In each of the regions 118, a shallow N well labeled "SNW" and numbered 121 is shown forming drain diffusions. Outside of the deep N-well regions 118, a shallow P-well labeled "SPW" and numbered 122 is shown, working with P-EPI 114 and PBL 116, this forms isolation between the integrated LDMOS device 100 and other nearby device junctions. In each of the regions 118, there is also a P buried layer region numbered 116 on the top of NBL 120 as shown in FIG. 1, forming charge balance between the PBL to DNW regions for a reduced surface field effect ("RESURF") of the LDMOS device. In an example arrangement the deep N wells 118 can be formed from n-type doped areas, while the shallow N well regions labeled "SNW" numbered 121 can be formed from low voltage CMOS N type diffusion wells used in a semiconductor process for MOS devices. These SNW regions 112 are used for making the LDMOS drain contact to DNW 118 electrical connection. Further, the drain terminals D formed in conductors overlying the substrate can be coupled with drain contact areas 128 can be formed from CMOS source/drain n+ doped diffusions.

In FIG. 1, two gate electrodes numbered 132 are shown overlying the substrate surface. In operation a potential on the gate terminal will turn on the transistors and form a channel region in the substrate where carriers can travel from source to drain. An N+ source region numbered 134 is formed within a p-type D-well diffusion labeled DWL and numbered 136. An additional P+ D-well contact region 135 butting with N+ source 134 is used for D-well connection. Isolation oxide regions 130 which may be formed by shallow trench isolation are shown in FIG. 1 overlying the drift regions and labeled "STI." The DNW is provided by an ion implant to form a drift region underneath STI, labeled "RESURF" 138, which is used to provide a reduced surface field effect ("RESURF") for the LDMOS transistor. The RESURF LDMOS transistor has an increased break down voltage BVdss, which is needed for handling the high voltages experienced by power devices.

In operation, electron carriers transit a channel region formed beneath the gate from the source region and then transit the drift region to the drain terminal. In an example application, the source terminal S is coupled to a ground potential while a high voltage, such as 35, 50 or more volts, is coupled to the drain terminal. The potential at the gate terminal 132 can then be used to turn on the device, and the high power current then flows through the device (from drain to source, opposite the electron carrier direction).

In the known approaches to power devices, use of LDMOS transistors is known to provide a device with a high breakdown voltage characteristic capable of handling very high voltages, for example 50 Volts at a source or drain terminal, and having relatively low resistance, Rdson. However, the prior known LDMOS device 100 depicted in FIG. 1 is still subject to various problems and performance issues. Devices that require less silicon area are also needed to increase the integration and to reduce the area of integrated circuits which include the LDMOS transistor. At a targeted high voltage of the LDMOS device, a single RESURF in drift region may be not enough to handle high voltage between the device drain to source at a reduced drift length that occurs as the semiconductor processes continue to shrink. Further, at a smaller drift length, the electric field in the region "X" (JFET area labeled "X" in FIG. 1) becomes stronger, which easily induces a lower device drain to source breakdown voltage and also leads to current crowding in the labeled "X" region, and this may result in a channel hot carrier ("CHC") effect. In CHC, some carriers (electrons or holes) can tunnel into the gate dielectric, for example, and become trapped, degrading the gate dielectric material, and lowering transistor device performance and reliability. In addition, the use of the buried layers "NBL and "PBL" adds complexity to a standard CMOS semiconductor manufacture process by requiring additional and specific photomasks, pattern, and implant steps, increasing production costs.

A continuing need thus exists for an LDMOS transistor device with improved reduced surface field effect performance. An LDMOS transistor that is manufacturable alongside standard CMOS devices is needed with reduced process steps and reduced costs when compared to prior known approaches. A need exists for an LDMOS device with very high breakdown voltage BVdss, reduced on-resistance, improved CHC performance, and which require lower silicon area at lower costs than that required for prior known LDMOS devices.

SUMMARY

The arrangements that form various aspects of the present application provide an LDMOS device formed in a semiconductor process having a double buffer arrangement and further formed using chain ion implantation steps to include cascade resurf diffusions in both the drift and the D-well regions for high performance. Corresponding method arrangements are also disclosed.

In an example arrangement that forms an aspect of the present application, an LDMOS device includes at least one drift region disposed in a portion of a semiconductor substrate and doped to a first conductivity type; at least one isolation structure at a surface of the semiconductor substrate and positioned within a portion of the at least one drift region; a D-well region in another portion of the semiconductor substrate doped to a second conductivity type and positioned adjacent a portion of the at least one drift region, and an intersection of the drift region and the D-well region forming a junction between the first and second conductivity types; a gate structure disposed on a surface of the semiconductor substrate and overlying a channel region and a portion of the isolation structure, the gate structure comprising a gate dielectric layer lying over the channel region and a gate conductor material overlying the gate dielectric; a source contact region disposed on the surface of the D-well region and at adjacent one side of the channel region, the source contact region begin doped to the first conductivity type; a drain contact region disposed in a shallow diffusion well on the surface of the drift region and adjacent the isolation structure and spaced from the channel region by the isolation structure, the drain contact and the shallow diffusion well doped to the first conductivity type; and a double buffer region comprising a first buried layer lying beneath the D-well region and the drift region and doped to the second conductivity type, and a second high voltage deep diffusion layer lying beneath the first buried layer and doped to the first conductivity type.

In another arrangement that forms a further aspect of the present application, a method for forming an LDMOS device includes providing a semiconductor substrate; forming an epitaxial layer over the semiconductor substrate; forming a first buried layer of a first conductivity type by implanting impurities in the epitaxial layer over the semiconductor substrate, the epitaxial layer and the semiconductor substrate doped to a second conductivity type; forming an in-line epitaxial layer of the second conductivity type over the buried layer; performing a first ion implant of the first conductivity type in a first chain implant to form a high voltage deep well buffer region; performing an ion implant of the second conductivity type to form a second buried layer disposed between the high voltage well region and a drift region, the high voltage deep well region and the second buried layer forming a double buffer region; forming an isolation region at a surface of the semiconductor substrate in the well of the first conductivity type; depositing a gate dielectric over the substrate, depositing a gate conductor over the gate dielectric, and then etching the gate conductor and the gate dielectric to form a gate structure overlying a channel region; and implanting impurities to form a source region spaced from the gate structure by the channel region and to form a drain region in the drift region and spaced from the gate structure by the isolation region.

In still another arrangement that forms additional aspects of the present application, an integrated circuit includes an LDMOS device, further including at least one drift region disposed in a portion of a semiconductor substrate and doped to a first conductivity type; at least one isolation structure at a surface of the semiconductor substrate and positioned within a portion of the at least one drift region; a d-well region in another portion of the semiconductor substrate doped to a second conductivity type and positioned adjacent a portion of the at least one drift region, and an intersection of the drift region and the D-well region forming a junction between the first and second conductivity types; a gate structure disposed on a surface of the semiconductor substrate and overlying a channel region and a portion of the isolation structure, the gate structure comprising a gate dielectric layer lying over the channel region and a gate conductor material overlying the gate dielectric; a source contact region disposed on the surface of the D-well region and at adjacent one side of the channel region, the source contact region begin doped to the first conductivity type; a drain contact region disposed in a shallow diffusion well on the surface of the drift region and adjacent the isolation structure and spaced from the channel region by the isolation structure, the drain contact and the shallow diffusion well doped to the first conductivity type; and a double buffer region comprising a first buried layer lying beneath the D-well region and the drift region and doped to the second conductivity type, and a second high voltage deep diffusion layer lying beneath the first buried layer and doped to the first conductivity type; and at least one CMOS device formed in the semiconductor substrate and spaced from the LDMOS device.

Recognition is made in the present application that arrangements for an LDMOS transistor with a double buffer formed of a p-type buried layer overlying a high voltage deep n-well layer, formed over an n-type buried layer, provide a high performance LDMOS transistor. In additional arrangements, chain resurf diffusion implants are made in both the drift and body regions to further reduce surface field effects, address channel hot carrier concerns, and reduce mask levels to reduce costs. Applications include power transistor devices such as low and high side drivers, automotive applications, RF circuitry, and high frequency devices.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which:

FIG. 14 depicts in a flow diagram a first series of processing steps used to form an LDMOS device in a semiconductor process arrangement of the present application; and FIG. 15 depicts in another flow diagram additional processing steps used to form an LDMOS device in a semiconductor process.

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

The making and using of various example illustrative arrangements that incorporate aspects of the present application are discussed in detail below. It should be appreciated, however, that the illustrative examples disclosed provide many applicable inventive concepts that can be embodied in a wide variety of specific contexts. The specific examples and arrangements discussed are merely illustrative of specific ways to make and use the various arrangements, and the examples described do not limit the scope of the specification, nor do they limit the scope of the appended claims.

For example, when the term "coupled" is used herein to describe the relationships between elements, the term as used in the specification and the appended claims is to be interpreted broadly, and while the term "coupled" includes "connected," the term "coupled" is not to be limited to "connected" or "directly connected" but instead the term "coupled" may include connections made with intervening elements, and additional elements and various connections may be used between any elements that are described as "coupled."

The present application includes arrangements that describe the formation of an LDMOS device using various implants to form diffused regions in a CMOS compatible semiconductor process. As is known to those skilled in the art, for MOS transistor devices the designation "source" and "drain" refers to the electrical connection of these regions, and in a cross sectional view of the physical structure of MOS devices, the "source" and "drain" are typically identical and symmetrical doped diffusion regions formed on opposing sides of the transistor gate. Those skilled in the art will recognize that an additional alternative arrangement to arrangements specifically described herein can be made by reversing the "source" and "drain" regions in many cases. Such alternative arrangements are contemplated by the inventor of the present application and fall within the scope of the appended claims.

Because the various ion implant steps used in forming the LDMOS RESURF devices of the arrangements are similar to those already used in the MOS fabrication processes, the novel processes used to produce the LDMOS RESURF device are achieved at relatively low cost, and further, the processes can also simultaneously be used to produce NMOS and/or PMOS transistors in the same integrated circuit as the LDMOS RESURF device. In this manner control, computation and input/output circuitry can be formed using CMOS devices produced alongside the LDMOS devices, making a single integrated circuit with all the required circuitry for use of the LDMOS device in a system easily manufacturable in existing semiconductor processes. In an alternative approach that is also contemplated as forming an additional aspect of the present application, the LDMOS RESURF transistor devices can be formed on a stand along integrated circuit device without additional NMOS and PMOS devices.

Figure 2:
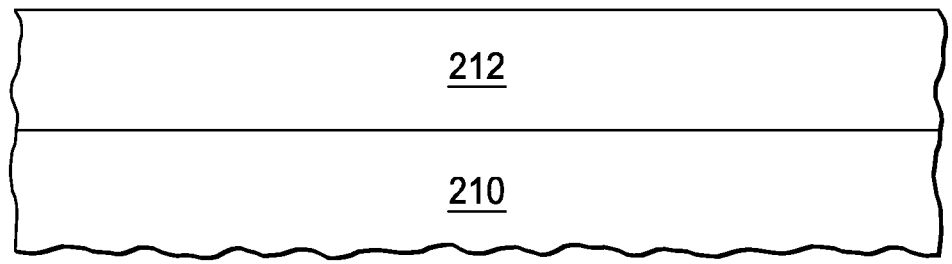
FIGS. 2-12 illustrate in a series of cross-sectional views the successive processing steps used to manufacture an LDMOS device using a semiconductor process arrangement of the present application.

FIG. 2 depicts the first in a series of cross sections presented that illustrate successive steps performed in construction of an LDMOS CASCADED RESURF device 200. The LDMOS CASCADED RESURF device 200 can be, in some arrangements, formed with slight modifications to an existing CMOS semiconductor process. A person skilled in the relevant art will recognize that there are alternative methods and orders of steps by which to accomplish the construction of the LDMOS CASCADED RESURF device and that this non-limiting example of fabrication is only one of those methods for this configuration. The semiconductor substrate 210 that hosts the LDMOS CASCADED RESURF device (and, in some arrangements that form aspects of the present application, also hosts other MOS transistor devices) can be in one example arrangement a P-type single crystal silicon substrate. It is also within the scope of the present application to form an LDMOS CASCADED RESURF device in any substrate that supports fabrication of an integrated circuit in a CMOS process including, but not limited to silicon-on-insulator (SOI) or a hybrid orientation technology (HOT) substrate, or on any epitaxial layer compatible with CMOS semiconductor fabrication. In FIG. 2, an initial epitaxial layer 212 is shown overlying which a P-type layer. This epitaxial layer can be omitted in some alternative arrangements. The substrate 210 and the epitaxial layer 212 are, in one example arrangement, provided as the starting material for the semiconductor process. In other arrangements, the epitaxial layer 212 is omitted.

Figure 3:
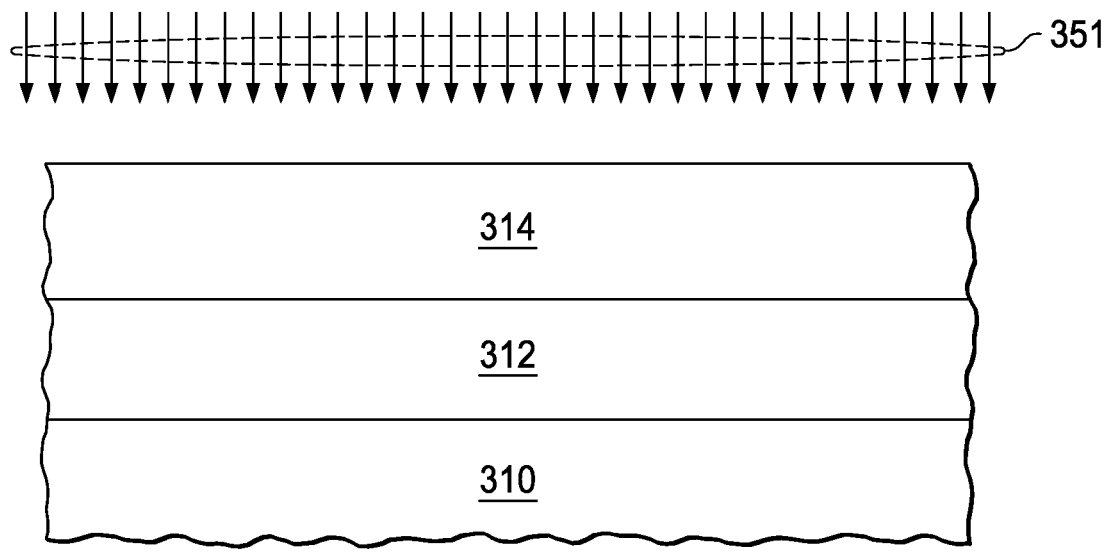

FIG. 3 depicts an LDMOS CASCADED RESURF device 300 in a cross-sectional view following a next step illustrating the fabrication of an N type buried layer or "NBL" numbered 314. To form this layer as shown in FIG. 3, a blanket implant 351 of an n-type dopant species is performed over the substrate 310 to form NBL 314. In a later step described below, a deep trench or deep trench with an n+ material can be formed and can be coupled to the NBL to form an N-type tank. This tank can be used to electrically isolate the LDMOS CASCADED RESURF device 300 from other areas and other devices on the substrate 310. As shown in FIG. 3, the buried layer 314 can be formed as a blanket implantation to P-epi 312 over the substrate 310. This is in sharp contrast to the prior known approaches and the blanket implantation does not require a mask, photoresist, pattern and photoresist strip process, instead the ion implantation of the NBL 314 can be performed without the need for a photomask. The NBL 314 can be formed by implanting n-type dopants such as phosphorus or arsenic to a very high concentration. For example an implant dose of $5 \times 10^{15}$ atoms/cm$^2$ can be used. In an alternative arrangement, a mask layer can be used prior to performing the implant step to form NBL 314. In this arrangement, an n-type tub structure can be formed surrounding the LDMOS device.

Figure 4:
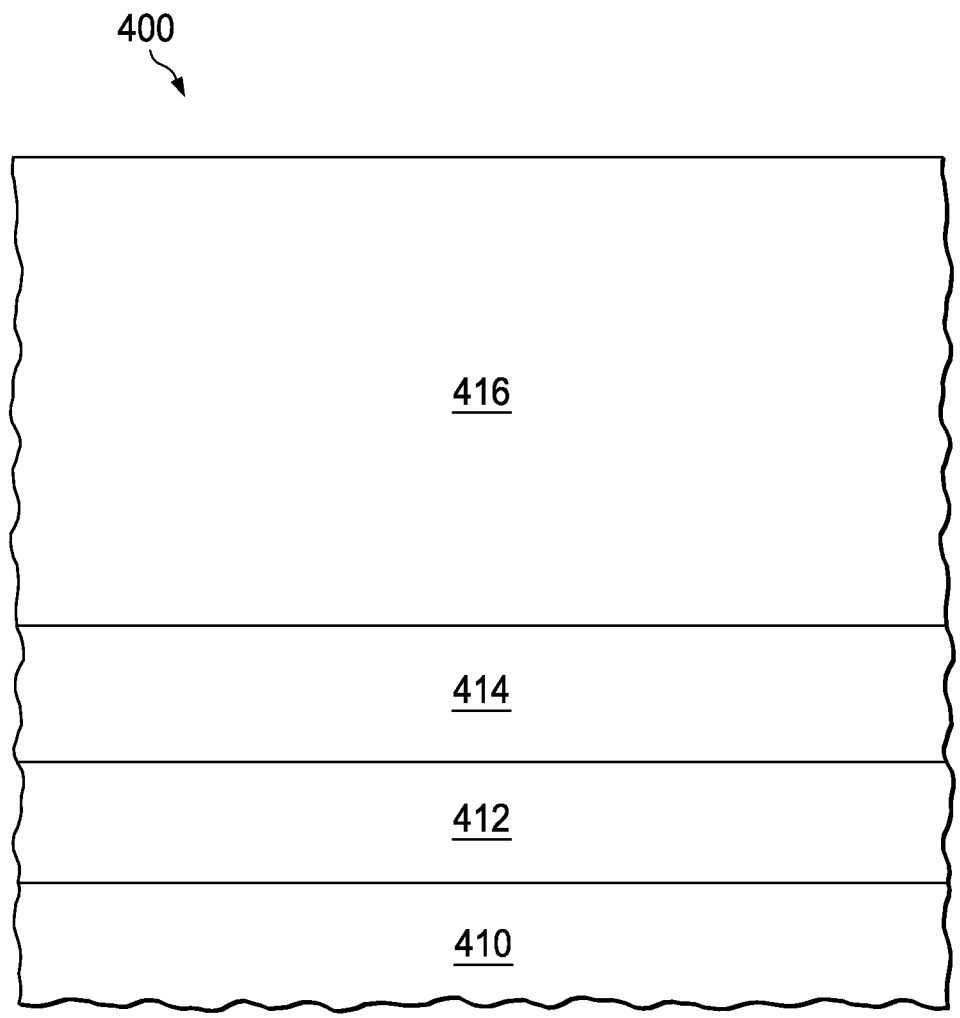

FIG. 4 depicts in a cross-sectional view the next steps performed in constructing an LDMOS device 400. In FIG. 4, an in-line epitaxial process is used to form a P-type epitaxial layer 416 over the n-type buried layer NBL 414. The initial layers of a p-epitaxial layer 412 and a substrate 410 are also shown arranged as described above.

Figure 5:
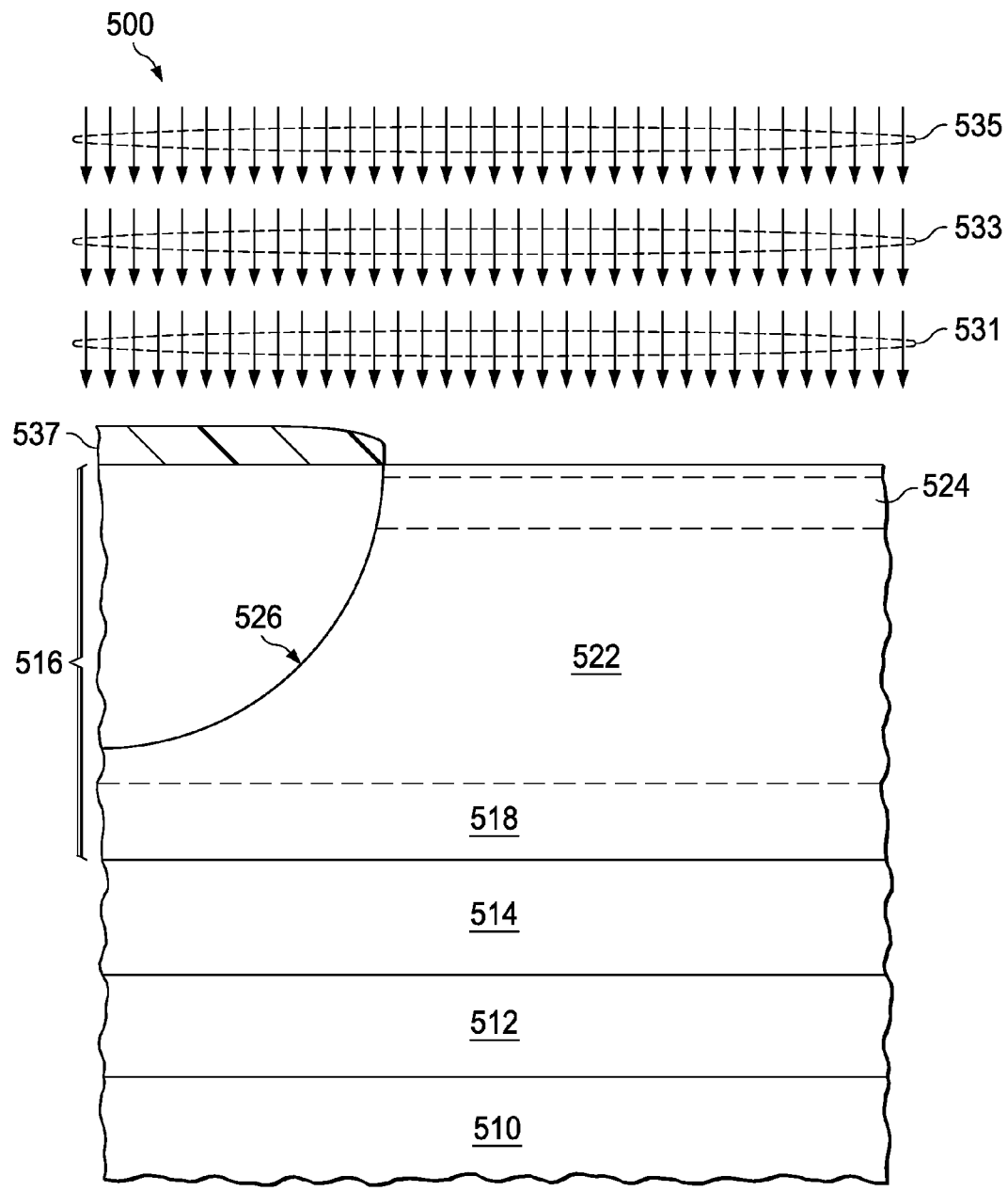

FIG. 5 depicts in a cross-sectional view an LDMOS device 500 following additional successive fabrication steps. In FIG. 5, a chain of ion implantation steps of n-type dopants is performed using a mask and patterning process to form a resist pattern 537. Several ion implantation areas are formed in a portion of the p-epitaxial layer 516. In a first ion implantation step, a high voltage deep N-well buffer 518 is formed by an ion implantation of phosphorous, for example, at an energy of 2-3 MeV, and at an implant dose of 1 to $3 \times 10^{12}$ atoms/cm$^2$ is performed.

Following the deep N-well buffer ion implant 531, a second n-type ion implant in the chain implant numbered 533 is performed, using phosphorous as the dopant atom, for example, at an implant energy of 600 KeV to 2 MeV and an implant dose of about 2 to about $5 \times 10^{12}$ atoms/cm$^2$. This forms an n-type doped region in the drift region 522.

Still referring to FIG. 5, a third implant in the chain of n-type ion implantation steps is performed to form an implant in a "JFET" region, numbered 524. An ion implant 535 is performed to form the JFET region, in one arrangement this implant can use arsenic dopant atoms at an implant energy of 100 Kev to 350 KeV and at an implant dose of about 1 to $9 \times 10^{12}$ atoms/cm$^2$. In this manner, the chain of n-type ion implants is performed in succession and no intervening steps or processes are required. An n-type well is formed by the mask 537 used during these implant steps so that a p-n junction is formed along line 526. After the chain of n-type ion implants are performed, a thermal step referred to as a driving step is performed to complete the diffusion regions.

Figure 6:
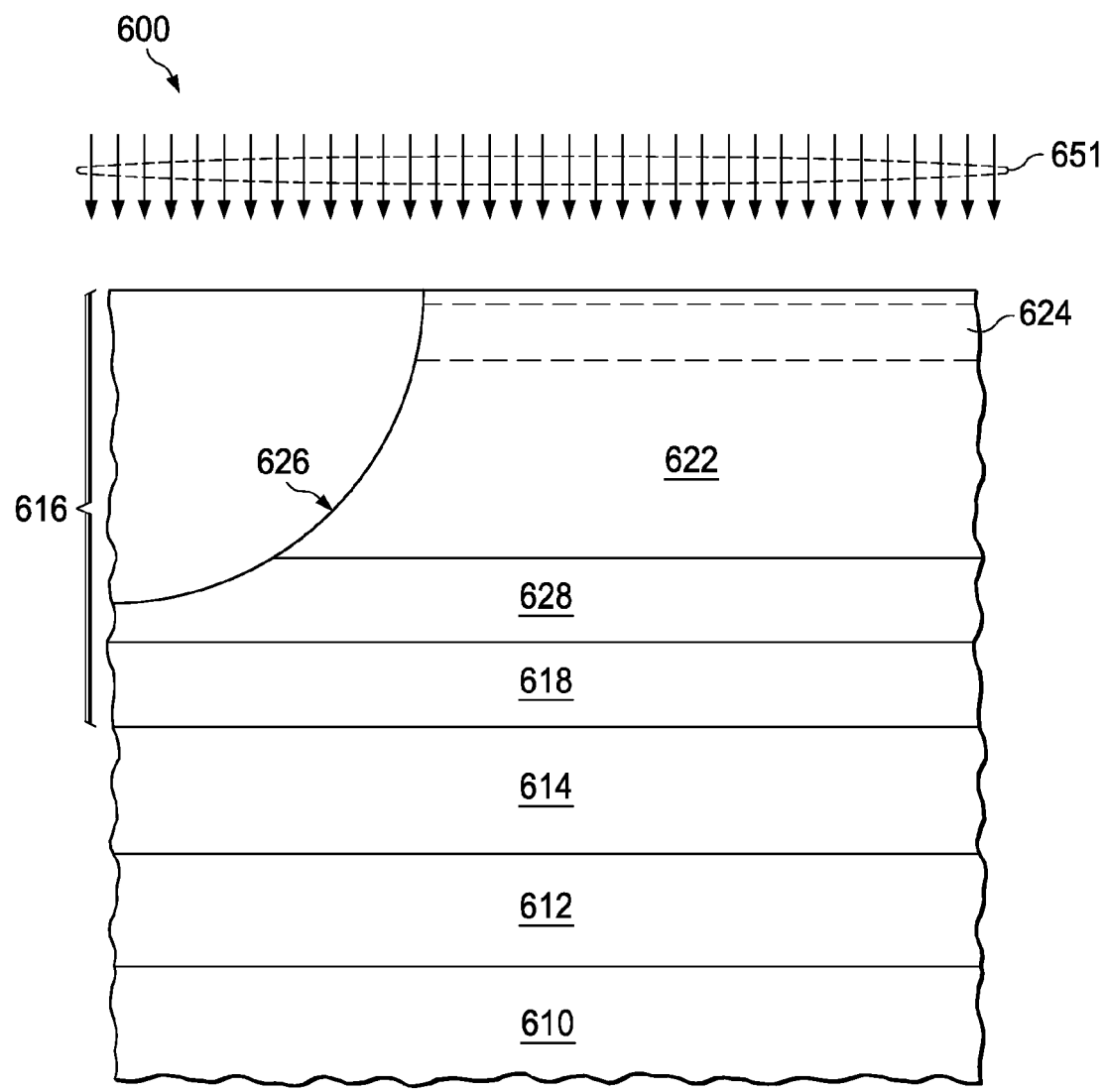

FIG. 6 illustrates in another cross-sectional view additional successive process steps forming an LDMOS device 600. In FIG. 6, an ion implantation step numbered 651 is shown and is performed to form a p-type buried layer PBL 628. In one arrangement this implant step is performed using a blanket implant, so that no mask, pattern and etch steps are needed, and the dopant used can be boron, for example. An implant energy of 800 KeV to 2.5 MeV can be used with an implant dose of from about 3 to $8 \times 10^{12}$ atoms/cm$^2$. The arrangements including HV deep N-well buffer numbered 618 and the p-buried layer PBL numbered 628 shown in FIG. 6 form a double buffer feature for the LDMOS devices. The LDMOS device drift region resistance can be significantly reduced by the dedicated PBL buffer 628 to N-well drift 622 region charge balance RESURF design of the present application. In the arrangements of the present application, a very low drift region resistance for the device on-state is achieved due to a higher HV Deep N-well doping concentration at a deep junction depth. The drift region 622, which will be disposed underneath an isolation region of STI as described in a later step below, could be pitched-off by the depletion region of the p-n junction between the PBL buffer 628 to the drift region 622 of the HV Deep N-well 618, enabling a higher drain to source off-state breakdown voltage. A relatively high PBL buffer doping concentration is needed to charge balance the high doped N-well drift region 622, and the concern of the NBL to the high doped PBL low avalanche breakdown in LDMOS devices of prior known approaches is improved by the inserted HV Deep N-well N-type buffer layer 618. In addition, a deep trench isolation structure (not visible in FIG. 6, but further described below) can be coupled to the NBL 614 and can form an isolated tub with N-type bottom and sides for the LDMOS device, further improving isolation. The p-n junction 626 is arranged as before. The p-type implantation step of FIG. 6 can be said to insert a p-type buried layer or PBL 628 into an n-type chain implant.

At this stage in the process, additional deep trench isolation structures surrounding the LDMOS device can be formed. In one arrangement, the deep trench or "DT" region can be formed of an oxide or other dielectric lining a trench with a P+ material formed inside the dielectric region and extending to the p-epitaxial layer. In a second arrangement, the DT structure can further include N+ material lining the trench and extending down to the N-buried layer, and in addition, a N+ material can be formed isolated by dielectric material from the P+ material, and extending to the NBL layer to from an N-type tub structure. Use of the DT structures provides excellent electrical isolation for the LDMOS devices. A topside contact can be formed to allow the tub to be electrically coupled to a potential for further isolation and noise control.

Figure 7:
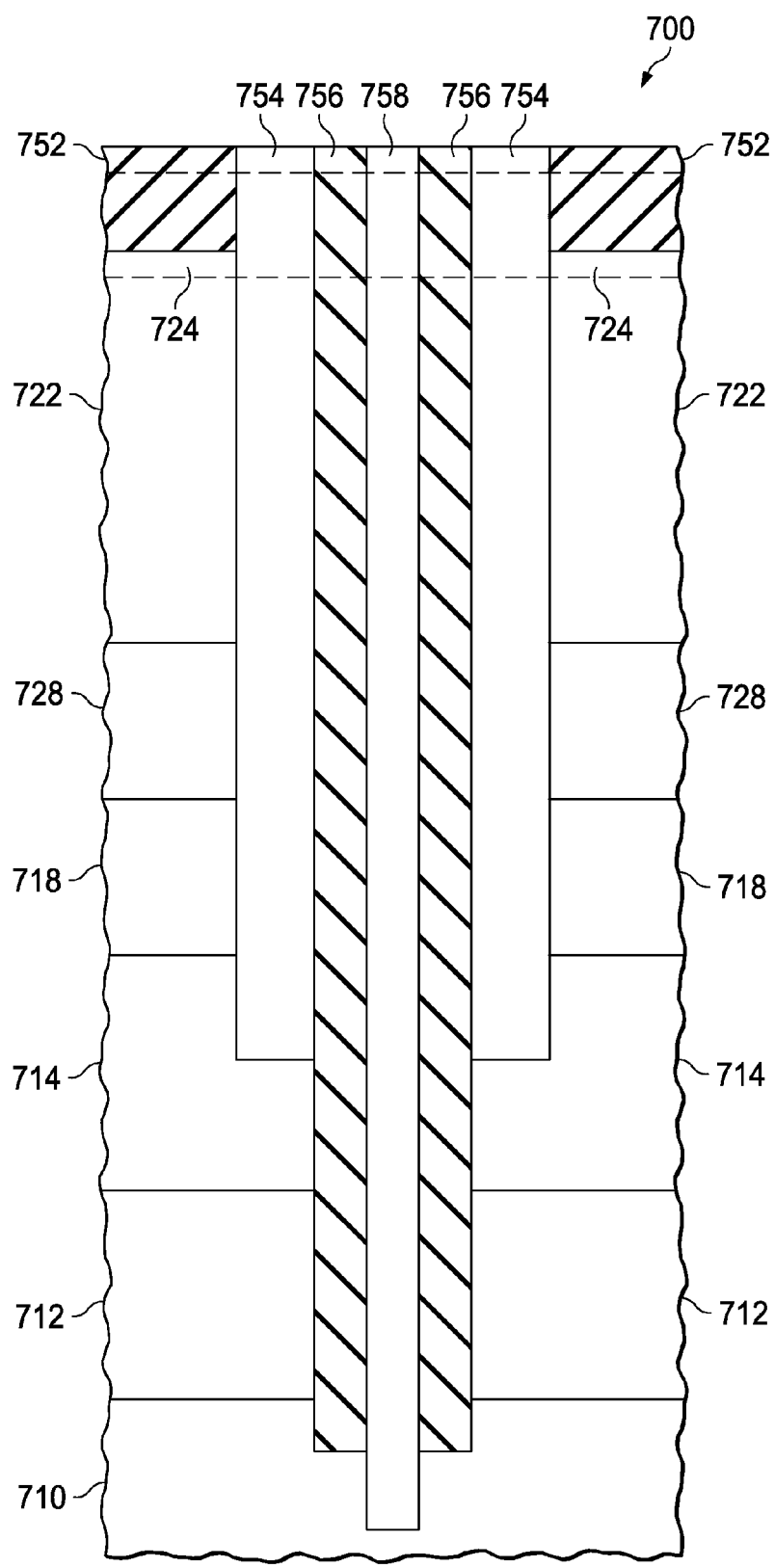

FIG. 7 depicts in a cross-sectional view a portion of a deep trench structure 700 that can be used with the arrangements. The deep trench structure 700 is formed after the PBL implantation in FIG. 6 is complete. The deep trench structure can be a trench with dielectric lining the sides and a P+ material 758 formed in the central portion and extending to the P-epitaxial layer 712, for example. In the arrangement of FIG. 7, the deep trench structure further includes N+ material 754. A dielectric portion 756 isolates the N+ portion from a P+ material 758. The N+ material 754 extends through the STI 752, the N-well material 722/724, the PBL 728, the deep N-well 718 and contacts the N-buried layer NBL 714. The P+ material 758 extends through all of these layers and into or through the P-epi layer 712 to contact the P-substrate 710. The deep trench 700 is shown in cross section but can extend around the LDMOS devices shown in the figures above in order to form a tub trench, and the N-buried layer 714 with the N+ material 754 can form an N-type isolation tub.

Figure 8:
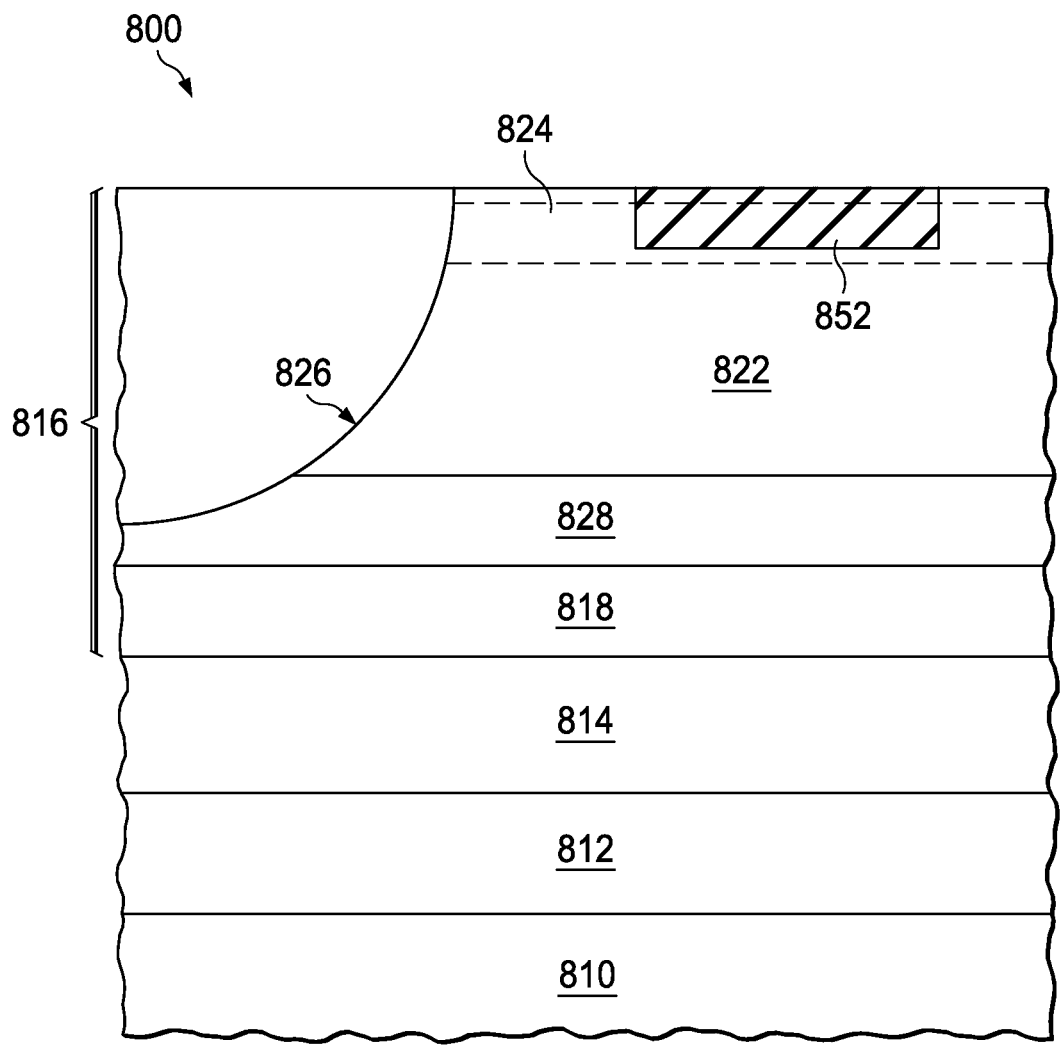

The STI layer 752 formed in FIG. 7 is also used as part of the LDMOS devices. In FIG. 8, an LDMOS device 800 is shown following successive steps from FIG. 6 including the formation of an STI insulator 852 over the drift region. In FIG. 8, LDMOS device 800 includes the STI layer 852, the JFET diffusion 824, the drift diffusion 822, which are N-type diffusions, the P-epi material 816, and the double buffer formed from PBL 828, and the HV deep N-well buffer 818, which are formed over the n-type buried layer NBL 814, the P-type epitaxial layer 812, and the P-type substrate 810, and the junction 826 are all arranged as described above. In an alternative arrangement, LOCOS isolation could be used in place of the STI layer 852.

Figure 9:
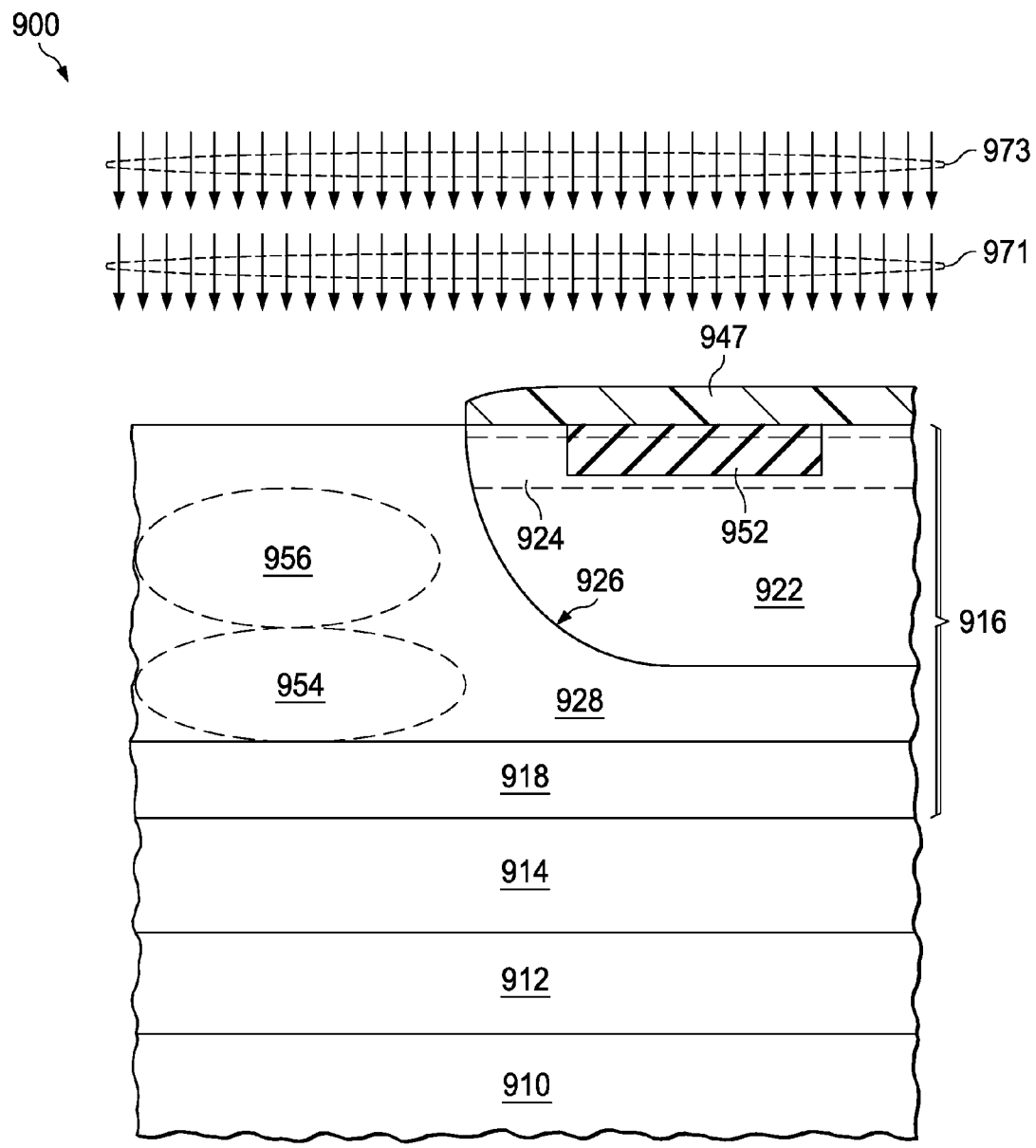

FIG. 9 depicts an LDMOS device 900 and illustrates additional process steps used to form the devices. In FIG. 9, a first chain implant of p-type dopants is performed to tailor the dopant levels in a D-well deep up/down body structure for the LDMOS device. A resist layer 947 is formed using a photomask, resist and pattern process. A chain of p-type implants begins with the implant numbered 971, using boron, for example, as the dopant and an implant energy of about 1 MeV to 2 MeV with an implant dose from about $3 \times 10^{12}$ atoms/cm$^2$ to about $8 \times 10^{12}$ atoms/cm$^2$. This implant forms a diffusion region 954 in the p-epi layer 916 and forms a portion of a deep up (diffusion 956)/down (diffusion 954) body region. Following the implant numbered 971, a second implant 973 is performed. In this ion implant step, a diffusion region 956 is formed above the previous diffusion region. In one arrangement, this second implant is performed using a boron implant with an implant energy of between 400 KeV to about 800 KeV with an implant dose of between $8 \times 10^{12}$ atoms/cm$^2$ to about $5 \times 10^{13}$ atoms/cm$^2$. The deep down-body diffusion 954 is used to link the D-well with the PBL, and the deep up-body diffusion 956 is used to build a distributed charge balance region to the N-well JFET region 924 close to the STI 952 bottom corner area for a lateral JFET RESURF. In FIG. 9, the substrate 910, the p-epitaxial layer 912, the NBL 914, the Deep N-well buffer 918, and the PBL 928, the N-well drift region 922 are all arranged as described above.

Figure 10:
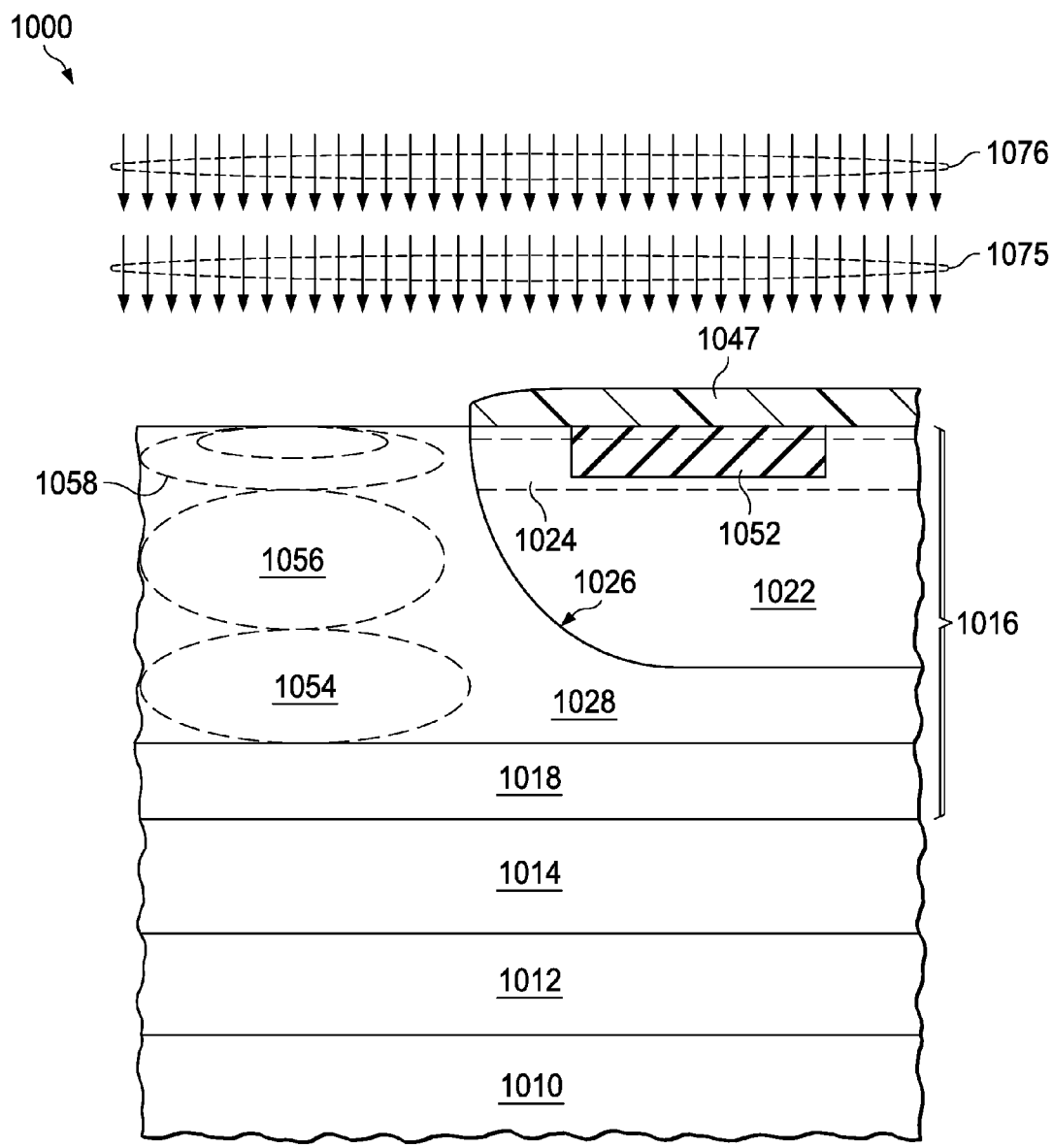

FIG. 10 illustrates in a next successive step for forming an LDMOS device 1000. In FIG. 10 an additional chain ion co-implantation is shown. This co-implant shares the same resist pattern and photomask as deep up/down body implants in FIG. 9 to form an additional diffusion region 1058, for a shallow body and effective channel region. This additional diffusion region 1058 controls field effects close to the substrate surface and this CHANNEL RESURF comes from a sub-surface charge balance near channel region on the device drain-side, which is adjusted by the D-well shallow-body (p-type ions from the co-implant diffusion 1058) to the top portion of HV deep N-well near the sidewall of STI 1052. The use of the channel resurf and JFET resurf diffusion concepts of the arrangements of the present application address the channel hot carrier concern, allowing a short channel device to be used without forming the channel hot carriers as seen in prior known approaches. In addition, the JFET region resistance is reduced due to more uniform current flow in this region. The ion implantation steps 1075 and 1076 in FIG. 10 are performed using p-type and n-type implant ions co-implanted into the diffusion region 1058, in which n-type area is used as part of the device n-type source and the co-implant p-type region forms the device D-well shallow-body. Both implants can be adjusted to control the LDMOS device effective channel region. In an example co-implant step 1075, a p-type implant shown as 1075 using can be performed using boron as the dopant atom at an implant energy of 60 Kev to 260 KeV using an implant dose of $1\times10^{13}$ atoms/cm$^2$ to about $3\times10^{14}$ atoms/cm$^2$. For the n-type co-implant 1076, arsenic can be implanted at an implant energy of about 20 KeV to about 220 KeV, at an implant dose of about $2\times10^{13}$ atoms/cm$^2$ to about $1\times10^{15}$ atoms/cm$^2$. These co-implant steps form a shallow body diffusion region 1058 of the device reducing the electric field at the surface of the channel region for the LDMOS device 1000 being formed.

The drift resurf, JFET resurf and channel resurf implant steps are cascaded together to improve device electric field distribution from the device drain to the drift region and to the JFET and channel regions for providing high performance LDMOS devices.

The remaining elements illustrated in FIG. 10, the STI 1052, JFET diffusion 1024, drift diffusion 1022 in the N-well, the p buried layer 1028, the HV deep N-well buffer 1018, the n buried layer NBL 1014, the P-epitaxial layer 1012, the substrate 1010, and are arranged as before. The body diffusions 1054, 1056 and 1058 provide additional performance in the body region of P-epitaxial layer 1016 which forms the D-well for the LDMOS device. As is described below, the source and body contacts for the LDMOS device will be formed over this D-well region. A junction 1026 forms between the D-well region in the p-epi material 1016 and the N-well region.

Figure 11:
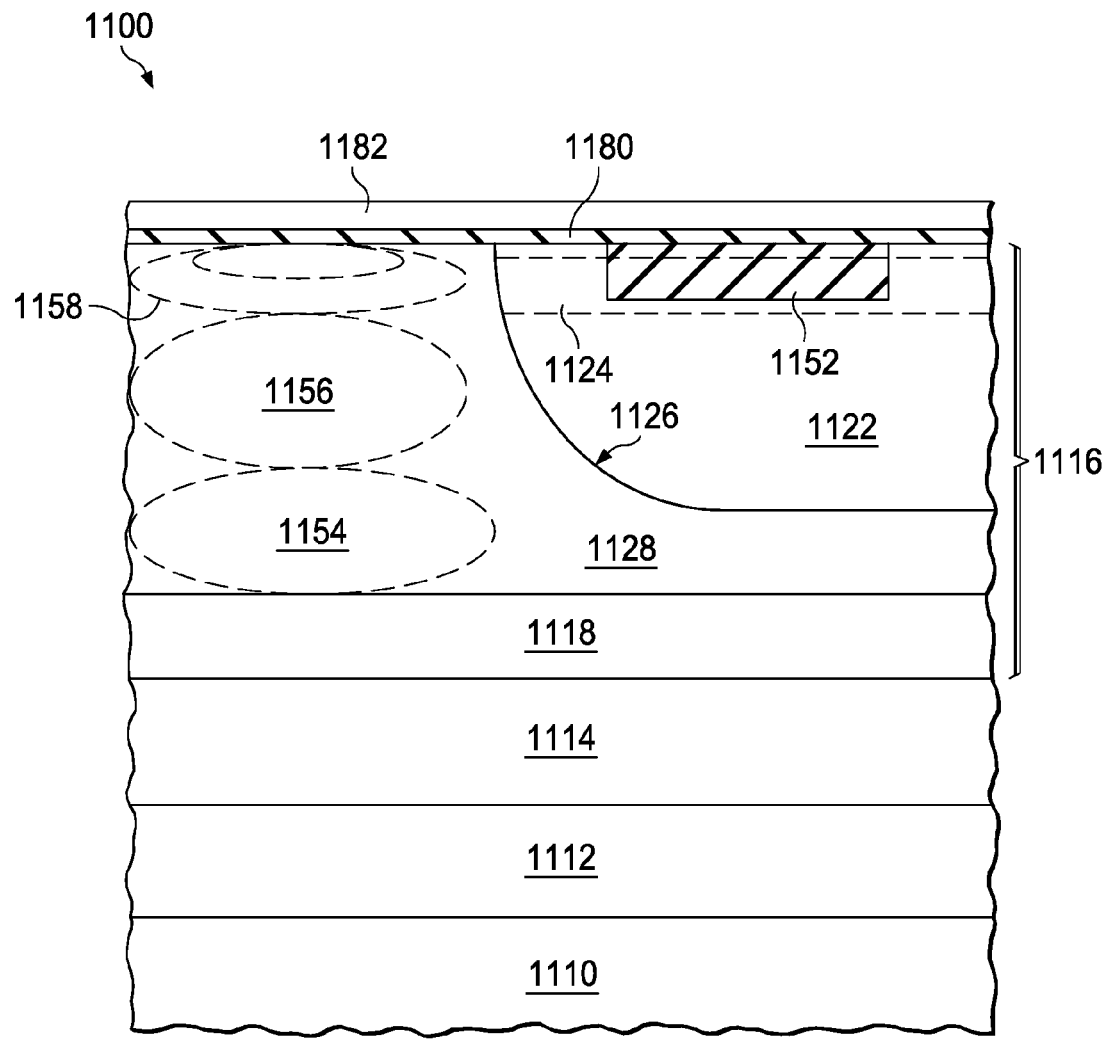

FIG. 11 depicts in a further cross sectional view the successive steps to form the gate and gate dielectric for an LDMOS device 1100. A gate dielectric layer 1180, typically of silicon dioxide, hafnium oxide or other insulating materials and having a thickness between about 1 nm and about 45 nm, is formed on the top of the substrate 1110 by known methods. The choice of the gate dielectric material and thickness is determined by the gate voltage rating desired for the LDMOS device, for example, gate voltage 1.5V, 3.3V, 5V, 12V and the like. In one arrangement that forms an aspect of the present application, additional NMOS gate and PMOS gate dielectric layers or gate insulators (not shown in FIG. 11) in other portions of the substrate 1110 can be fabricated with similar materials and similar thicknesses, and can be formed concurrently in time with the LDMOS gate dielectric 1180. Alternatively the PMOS and NMOS gate dielectrics can be formed independently of the LDMOS gate dielectric of different materials and/or thicknesses.

Still referring to FIG. 11, a gate 1182 is formed on top of the gate dielectric 1180. The gate 1182 is typically formed from polycrystalline silicon, referred to as polysilicon. The polysilicon is deposited over the gate dielectric layer and can also be deposited over NMOS and PMOS gate dielectric layers (not shown) to form NMOS and PMOS gate structures elsewhere on the substrate 1110.

The remaining elements illustrated in FIG. 11, the STI 1152, JFET diffusion 1124, drift diffusion 1122 in the N-well, the p buried layer 1128, the HV deep N-well buffer 1118, the n buried layer NBL 1114, the P-epitaxial layer 1112, the substrate 110, and the junction at 1126 are arranged as before. The D-well or body diffusions 1154, 1156 and co-implant region 1158 provide additional performance in the body region of P-epitaxial layer 1116 which forms the D-well for the LDMOS device. As is described below, the source and body contacts for the LDMOS device will be formed over this D-well region. A junction 1126 forms between the D-well region in the p-epi material 1016 and the N-well region.

Figure 12:
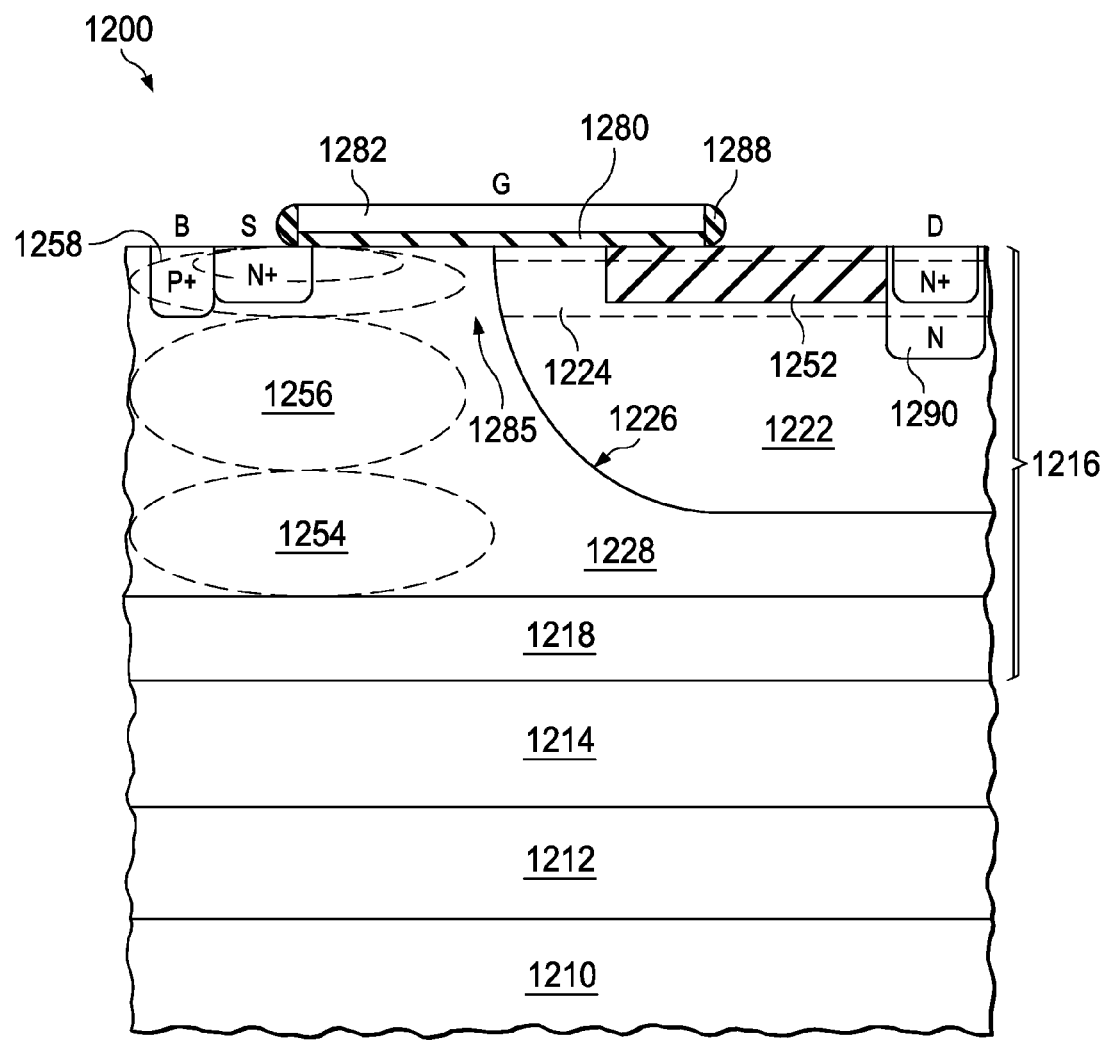

FIG. 12 depicts in another cross-sectional view an LDMOS device 1200 following additional processing steps. A gate photoresist pattern, not illustrated for simplicity, is applied over the gate 1282 and patterned for an etch process. Any unwanted gate polysilicon and the unwanted portions of the underlying gate dielectric are removed by known etching methods. The gate photoresist is then also removed. The gate structures for any NMOS and/or PMOS transistors that are disposed in portions of the semiconductor substrate 1210 that are located elsewhere in the substrate 1210, and that are not visible in FIG. 12, can be simultaneously patterned while the LDMOS gate polysilicon 1282 is formed. In some arrangements that form additional aspects of the present application, a replacement gate such as a metal gate can be used to replace the polysilicon gate 1282 at a later processing step. As shown in FIG. 12, gate sidewall spacers 1288 are then formed of an insulator such as an oxide, oxynitride, or nitride layer. The gate spacers 1288 can be formed by oxide deposition, or by other known means. The gate spacers are then formed by an anisotropic etch step. As for other steps described herein, gate structures for NMOS and/or PMOS devices being contemporaneously fabricated in other portions of substrate 1210, not visible in FIG. 12, can be formed simultaneously.

Still referring to FIG. 12, a shallow N-well 1290 is formed by using low voltage PMOS N-well implant, which is typically formed before gate oxide and gate polysilicon process steps. In an example arrangement, this well 1290 for the LDMOS drain region is also formed contemporaneously with N-well regions formed for CMOS devices being fabricated elsewhere on the substrate 1210.

Referring still further to FIG. 12, the P+ body contact, labeled B, the N+ source contact labeled S, and the drain contact, labeled D, are formed in additional processing steps. In an arrangement, the contact implant steps are also used to form source and drain contacts for CMOS devices located elsewhere on the substrate. A contact to the gate G is also formed.

The cross section shown in FIG. 12 illustrates a substantially complete LDMOS device 1200. The LDMOS device 1200 includes the body, source, gate and drain contacts B, S, G and D, the double buffer formed by the HV deep N-well buffer 1218 and the p-type buried layer PBL 1228, the drift region resurf implants 1222, 1224 forming the drift and JFET resurf diffusions, the up/down body diffusions 1256, 1254 in the D-well region, and the channel resurf diffusion 1258 formed by a co-implant process. The NBL 1214, p-epitaxial layer 1212 and substrate 1210 are all arranged as before.

In operation, a channel region 1285 is formed beneath the gate region between the source N+ region labeled "S" and the p-n junction 1226 between the p-type D-well region and the n-type drift region. When a potential greater than a threshold is applied to the gate terminal G, an inversion region forms and carriers can travel across the channel from the N+ source region labeled S and into the drift region, and then drift to the N+ drain region D beneath the STI insulator 1252. The use of the various doped diffusions in the channel, body region, and drift region formed by the chain ion implant steps described above reduces surface field effects to provide a "resurf" device, increases the break down voltage BVdss, and provides reasonably low drain to source on-resistance RDson to enable a high performance LDMOS transistor.

Figure 13:
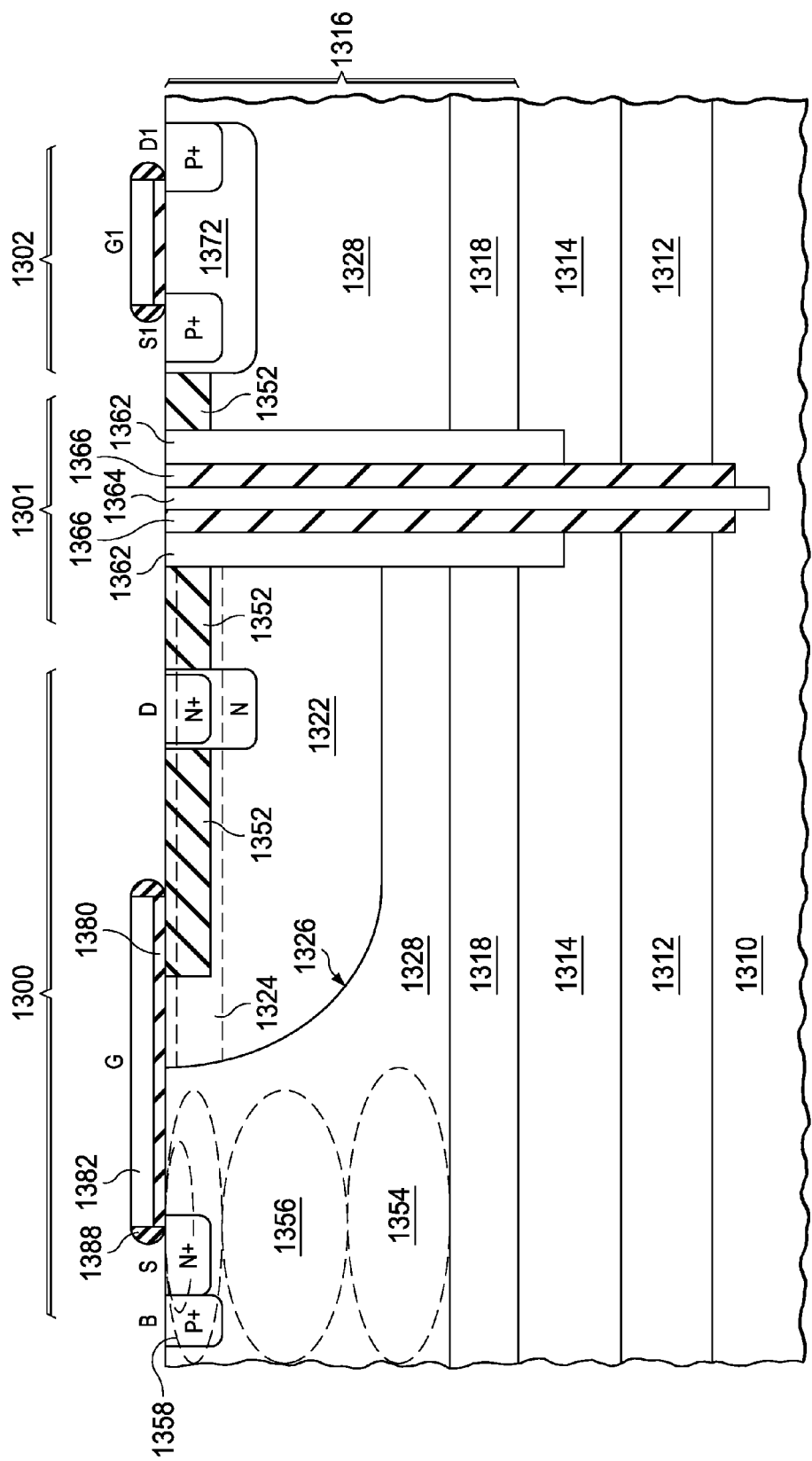
FIG. 13 illustrates in a cross-sectional view an arrangement for an LDMOS transistor and a PMOS transistor constructed adjacent to each other on a substrate.

FIG. 13 depicts in another cross-sectional view a completed LDMOS device 1300 built concurrently with a MOS transistor formed within a CMOS semiconductor fabrication process. FIG. 13 illustrates the capability of forming both CMOS and LDMOS devices concurrently on the substrate. The LDMOS device 1300 includes the body, source, gate and drain contacts B, S, G and D, the double buffer formed by the HV deep N-well buffer 1318 and the p-type buried layer PBL 1328, the drift region resurf implants 1322, 1324 forming the drift and JFET resurf diffusions, the up/down body diffusions 1356, 1354 in the D-well region, and the channel resurf diffusion 1358 formed by a co-implant process. A p-n junction 1326 is formed between the D-well region in the p-epi region 1316, and the N-well region. A deep trench isolation structure 1301 is formed by the n-type material 1362 extending to and contacting the NBL 1314, and the p-type material 1364 extending to the substrate 1310 and including a dielectric region 1364 to isolate the two materials from one another. In a low voltage CMOS region 1302 a PMOS transistor is shown formed having a source contact labeled S1, a gate labeled G1, and a drain contact labeled D1 in a shallow N-well 1372 with a separated N+ N-well contact (not shown in FIG. 13). As described above, certain process steps following the chain implants used to form the LDMOS device can be used to form structures for both the LDMOS and for CMOS devices, enabling the concurrent fabrication of both types of devices in substrate 1310. For example, the polysilicon gate material G, G1 is formed for both types of devices at the same time. In this manner highly integrated circuit devices including, for example, LDMOS high side drivers and associated high voltage CMOS control circuitry for controlling the drivers, can be formed in a single integrated circuit on a silicon substrate.

FIG. 14 illustrates in a flow diagram the steps of a method for forming an LDMOS device in an example arrangement. In FIG. 14, the method begins at step 1401, with a P-epitaxial layer over a P substrate, for example. At step 1403 the blanket formation of an N-type buried layer is performed by ion implantation. In an example, the ion implantation uses very high concentration, an implant dose of up to $5\times10^{15}$ atoms/cm$^2$ of n-type dopant is used. In one approach a blanket n-type buried layer is formed, with no mask required. In an alternative approach, a mask layer is used and a selective implant is done. In this approach, a deep N structure is later formed contacting the NBL material, to complete an n-type tub surrounding the LDMOS device.

At step 1405 in FIG. 14, an inline epitaxial layer of P material is formed to provide the base material for the LDMOS devices, the Deep N-well and body regions, and for CMOS devices that can be concurrently formed on the substrate.

At step 1407, the chain n-type ion implantation is performed. The first implant in the chain uses phosphorous as the dopant atom at an implant energy of 2 MeV to 3 MeV with a dose of from $1\times10^{12}$ atoms/cm$^2$ to $3\times10^{12}$ atoms/cm$^2$. This implant forms the high voltage deep N-well buffer layer as described above. A second implant in the n-type chain is then performed again using an n-type dopant such as phosphorous at an energy level from 600 KeV to about 2 MeV with an implant dose from $2\times10^{12}$ atoms/cm$^2$ to about $5\times10^{12}$ atoms/cm$^2$. This implant forms the diffusion in the drift region for device drift resurf control. Next a third n-type implant is performed in the n-type chain using arsenic, for example, at an energy level from about 100 KeV to about 350 KeV with a does from $1\times10^{12}$ atoms/cm$^2$ to about $9\times10^{12}$ atoms/cm$^2$ to form the diffusion in the JFET region as described above. The use of these implant regions over the double buffer improves performance of the cascaded resurf LDMOS devices.

At step 1409, a p buried layer is formed inserted into the n-type diffusions formed by the n-type chain implants. This p-type buried layer or PBL is formed by an ion implant of boron, for example, at an implant energy from about 800 KeV to about 2.5 MeV from about $3\times10^{12}$ atoms/cm$^2$ to about $8\times10^{12}$ atoms/cm$^2$. The PBL layer overlies the HV deep n-well N-type buffer region to form a double buffer structure and a drift region resurf design for the LDMOS transistors as described above.

At step 1411 in FIG. 14, an isolation structure is formed. If the n-type buried layer NBL formed at step 1403 was formed in a blanket step, a deep trench isolation structure can be used, such as is shown in FIG. 7 or FIG. 13, for example. In an alternative approach if a mask is used to form the NBL at step 1403, the isolation structure can be a deep n-type contact to form a tub with the n-type buried layer, surrounding the area for the LDMOS devices.

As shown in FIG. 14, the method then transitions to step 1501 in FIG. 15.

In FIG. 15, the flow diagram continues. FIG. 15 shows the remaining steps for the method of forming the LDMOS transistors. At step 1501, the shallow trench isolation or STI regions are formed for the LDMOS transistors. At the same time, additional STI regions can be formed in other regions of the substrate for CMOS transistors, as described above. At step 1503, a first chain of p-type implants is performed to complete the first part of D-well or deep up/down body region of the LDMOS device. The down-body part is used to connect D-well with PBL and up-body part is to support JFET resurf near the bottom of the STI corner region of the LDMOS device. A first implant is performed using, for example, boron as the dopant atom at an implant energy of 1 MeV to 2 MeV with an implant dose of between $3\times10^{12}$ atoms/cm$^2$ to about $8\times10^{12}$ atoms/cm$^2$; a second p-type implant is then performed using boron with an implant energy of about 400 KeV to about 800 KeV with an implant dose from about $8\times10^{12}$ atoms/cm$^2$ to about $5\times10^{13}$ atoms/cm$^2$.

Following step 1503, a second chain of co-implants, 1505, is performed continuously using the same D-well implant mask layer using, for example, boron as a p-type dopant and arsenic as an n-type dopant. The p-type implant is performed with an implant energy from about 60 KeV to about 260 KeV and with an implant dose from about $1\times10^{13}$ atoms/cm$^2$ to about $3\times10^{14}$ atoms/cm$^2$; the n-type implant is performed with an implant energy from about 20 KeV to about 220 KeV and an implant dose from about $2\times10^{13}$ atoms/cm$^2$ to about $1\times10^{15}$ atoms/cm$^2$. As described above, the co-implant forms a shallow body and effective channel region with channel resurf design for the LDMOS device.

In the arrangements of the present application, the drift resurf, JFET resurf and channel resurf ion implantations are cascaded together to improve device electric field distribution from the device drain drift area to JFET and channel regions for the high performance of LDMOS devices.

At step 1507 in FIG. 15, the method continues. At this step, concurrent process steps for forming the remaining structures for the LDMOS device, e.g. the gate dielectric, the gate conductor, the source, body and drain regions, can be performed concurrently with similar steps for the fabrication of CMOS devices, for example PMOS and NMOS transistors, elsewhere on the substrate. In this manner highly integrated circuit devices can be fabricated incorporating the LDMOS devices of the arrangements. At step 1509 in FIG. 15, the illustrated method ends. After the method shown in FIGS. 14 and 15 is performed, the semiconductor fabrication process continues using conventional steps to connect the structures to metallization patterns, including silicide formation, interlevel dielectric, vias, and contact formation, metal deposition and patterning, and so forth to couple the source, body, drain and gate terminals of the LDMOS devices, and the source, drain and gate terminals of the CMOS devices, if present, to various signals using upper conductive layers such as metal conductors, for example.

Using the methods shown in FIGS. 14 and 15, LDMOS devices that have excellent performance can be obtained using a standard CMOS semiconductor process with only two additional mask levels, one for the n-type drift region, and one for the D-well or body region. The chain implants are performed in successive steps using a single mask. The n-type buried layer and the p-type buried layer of the double buffer used in the arrangements can be formed in blanket ion implantation without using masks, as described above, thereby reducing manufacturing costs.

Figure 1:
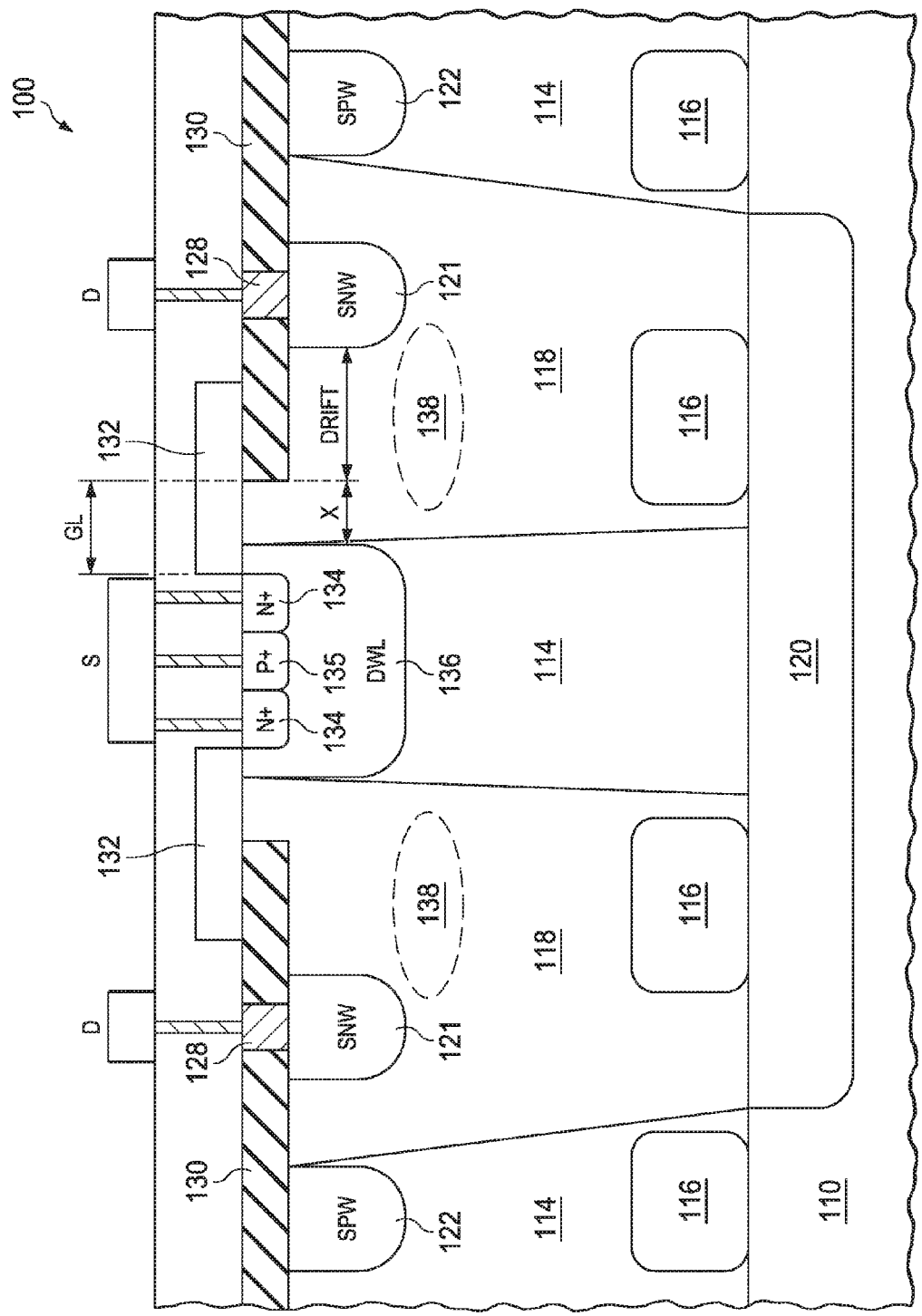
FIG. 1 depicts in a simplified cross-sectional view an example LDMOS device of a prior known approach.

Performance metrics have been obtained for example LDMOS devices formed using the double buffer and cascaded resurf diffusions arrangements as described above. The devices exhibit excellent breakdown voltages and reduced resistance when compared to devices obtained using the prior approaches such as the devices shown in FIG. 1.

The LDMOS devices obtained using the novel arrangements and structures described above have shown an average reduction in specific on resistance of 32.6% over the prior approach, and meet automotive industry guidelines for maximum Id shift over 10 years DC.

From a manufacturing cost and complexity point of view, the methods for forming the LDMOS devices with double buffers and cascaded resurf diffusions provide the lowest mask count LDMOS process known to the inventor. Further the device on resistance Rdson obtained using the arrangements of the present application is lower than known prior approaches.

Various modifications can also be made in the order of steps and in the number of steps to form additional novel arrangements that incorporate aspects of the present application, and these modifications will form additional alternative arrangements that are contemplated by the inventors as part of the present application and which fall within the scope of the appended claims.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. An LDMOS device, comprising:
   at least one drift region disposed in a portion of a semiconductor substrate and doped to a first conductivity type;
   at least one isolation structure at a surface of the semiconductor substrate and positioned within a portion of the at least one drift region;
   a D-well region in another portion of the semiconductor substrate doped to a second conductivity type and positioned adjacent a portion of the at least one drift region, and an intersection of the drift region and the D-well region forming a junction between the first and second conductivity types;
   a gate structure disposed on a surface of the semiconductor substrate and overlying a channel region and a portion of the isolation structure, the gate structure comprising a gate dielectric layer lying over the channel region and a gate conductor material overlying the gate dielectric;
   a source contact region disposed on the surface of the D-well region and adjacent one side of the channel region, the source contact region being doped to the first conductivity type;
   a drain contact region disposed in a diffusion well on the surface of the drift region and adjacent the isolation structure and spaced from the channel region by the isolation structure, the drain contact and the diffusion well doped to the first conductivity type;
   a double buffer region further comprising a first buried layer lying beneath the D-well region and the drift region and doped to the second conductivity type, and a second high voltage diffusion layer lying beneath the first buried layer and doped to the first conductivity type;
   a first p-type diffusion region in the D-well region adjacent the first buried layer forming a deep down body diffusion; and a second p-type diffusion region in the D-well region adjacent the junction with the drift region forming an up body diffusion.

2. The LDMOS device of claim 1, wherein the first conductivity type is n-type and the second conductivity type is p-type.

3. The LDMOS device of claim 1, and further comprising:
a first n-type resurf diffusion region in the drift region and a second n-type JFET resurf diffusion region in the drift region adjacent the junction with the D-well region, and above the first n-type resurf diffusion region.

4. The LDMOS device of claim 3, further comprising a third n-type diffusion near the channel region.

5. The LDMOS device of claim 1, further comprising a third p-type diffusion region in the source contact region and channel region.

6. The LDMOS device of claim 1, wherein the semiconductor substrate further includes an epitaxial layer of the second conductivity type.

7. The LDMOS device of claim 6, wherein the LDMOS device further includes a second buried layer beneath the high voltage well and formed in the epitaxial layer in the semiconductor substrate as an implant region of the first conductivity type.

8. The LDMOS device of claim 7, wherein the LDMOS device further comprises a isolation structure spaced from the D-well region and extending from the surface of the substrate through the first buried layer, the high voltage diffusion layer, and through the epitaxial layer and making contact to the semiconductor substrate.

9. The LDMOS device of claim 7, further comprising a trench isolation structure spaced from the D-well region and extending from the surface of the substrate through the first buried layer and the high voltage well and into the second buried layer.

10. The LDMOS device of claim 9, wherein the trench isolation structure further comprises material of the first conductivity type in physical contact with the second buried layer.

11. A method for forming an LDMOS device, comprising:
providing a semiconductor substrate;
forming an epitaxial layer over the semiconductor substrate;
forming a first buried layer of a first conductivity type by implanting impurities in the epitaxial layer over the semiconductor substrate, the epitaxial layer and the semiconductor substrate doped to a second conductivity type;
forming an in-line epitaxial layer of the second conductivity type over the buried layer;
performing a first ion implant of the first conductivity type in a first chain implant to form a high voltage deep well buffer region;
performing an ion implant of the second conductivity type to form a second buried layer disposed between the high voltage deep well buffer region and a drift region, the high voltage deep well buffer region and the second buried layer forming a double buffer region;
forming an isolation region at a surface of the semiconductor substrate in the well of the first conductivity type;
depositing a gate dielectric over the substrate, depositing a gate conductor over the gate dielectric, and then etching the gate conductor and the gate dielectric to form a gate structure overlying a channel region; and
implanting impurities to form a source region spaced from the gate structure by the channel region and to form a drain region in the drift region and spaced from the gate structure by the isolation region.

12. The method of claim 11 wherein the first conductivity type is n-type and the second conductivity type is p-type.

13. The method of claim 12, wherein performing the first chain implant further comprises performing a second ion implant of the first conductivity type to form a drift resurf diffusion in a well region and performing a third ion implant of the first conductivity type to form a JFET resurf diffusion in the well region and above the drift resurf diffusion.

14. The method of claim 12, and further comprising, after forming the isolation region, performing a second chain ion implant of the second conductivity type by performing a first implant of the second chain ion implant comprising implanting impurities of the second conductivity type to form a first D-well region down diffusion and performing a second implant of the second chain ion implant comprising implanting impurities of the second conductivity type to form a second D-well up diffusion region above the first D-well region down diffusion.

15. The method of claim 14 and further comprising performing an additional chain implants to co-implant ions of both the first and second conductivity type to form a shallow resurf diffusion region in the channel region.

16. The method of claim 12 and further comprising, after forming the second buried layer, forming a deep trench isolation structure extending from the surface of the substrate through the second buried layer and through the first buried layer to physically contact the semiconductor substrate.

17. An integrated circuit, comprising:
an LDMOS device, further comprising:
at least one drift region disposed in a portion of a semiconductor substrate and doped to a first conductivity type;
at least one isolation structure at a surface of the semiconductor substrate and positioned within a portion of the at least one drift region;
a D-well region in another portion of the semiconductor substrate doped to a second conductivity type and positioned adjacent a portion of the at least one drift region, and an intersection of the drift region and the D-well region forming a junction between the first and second conductivity types;
a gate structure disposed on a surface of the semiconductor substrate and overlying a channel region and a portion of the isolation structure, the gate structure comprising a gate dielectric layer lying over the channel region and a gate conductor material overlying the gate dielectric;
a source contact region disposed on the surface of the D-well region and at adjacent one side of the channel region, the source contact region being doped to the first conductivity type;
a drain contact region disposed in a shallow diffusion well on the surface of the drift region and adjacent the isolation structure and spaced from the channel region by the isolation structure, the drain contact and the shallow diffusion well doped to the first conductivity type, the shallow diffusion well being shallower than the drift region; and
a double buffer region further comprising a first buried layer lying beneath the D-well region and the drift region and doped to the second conductivity type, and a second high voltage deep diffusion layer lying beneath the first buried layer and doped to the first conductivity type; and at least one MOS device formed in the semiconductor substrate and spaced from the LDMOS device.

18. The integrated circuit of claim 17, wherein the at least one MOS device further comprises a PMOS transistor.

19. The integrated circuit of claim 7, wherein the first conductivity type is n-type, and the second conductivity type is p-type.

* * * * *